THERMOELECTRIC MATERIALS
Filed Sept. 15, 1959
Fig. I.
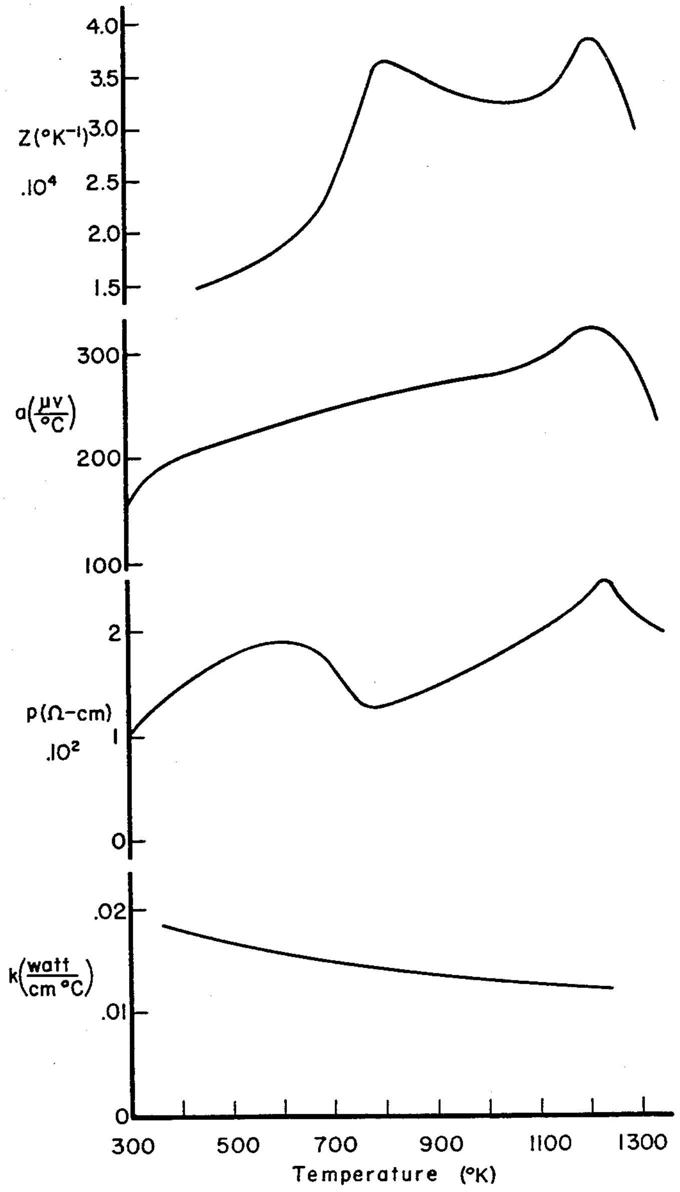
Fig. 2.
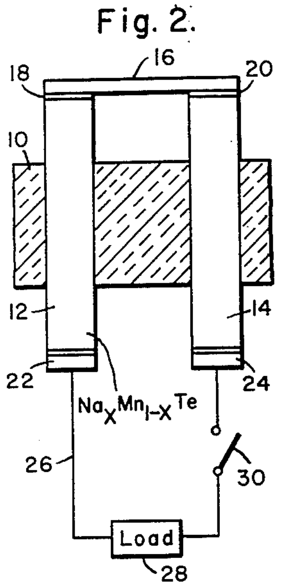
WITNESSES
Wm. B. Sellers.
James F. Young
INVENTORS
William D. Johnston, Robert C. Miller
and Armand J. Panson.
BY
Frederick Shapoe
ATTORNEY United States Patent Office
2,977,399
Patented Mar. 28, 1961

2,977,399

THERMOELECTRIC MATERIALS

William D. Johnston, Robert C. Miller, and Armand J. Panson, Pittsburgh, Pa., assignors to Westinghouse Electric Corporation, East Pittsburgh, Pa., a corporation of Pennsylvania Filed Sept. 15, 1959, Ser. No. 840,084

4 Claims. (Cl. 136—5)

The present invention relates generally to thermoelements, and particularly to theromelements comprised of sodium manganese telluride, and thermoelectric devices embodying the same.

It has been regarded as highly desirable to produce thermoelectric devices wherein either an electric current is passed therethrough to provide for cooling application or alternatively a source of heat is applied to one junction of a thermoelectric device to bring this junction to a given elevated temperature while the other junction is kept at a low temperature whereby an electrical voltage is generated within a device. For refrigeration or cooling applications in particular, one junction of the thermoelectric device is disposed in insulated chamber, and an electrical current is passed through the junction in such a direction that the junction within the chamber becomes cooler while the other junction of the thermoelectric device is disposed externally of the chamber and dissipates heat to a heat sink, such as the atmosphere, cooling water or the like.

When heat is applied to one junction of a thermoelectric device while the other junction is cooled, an electrical potential is produced proportional to the thermoelectric power of the thermoelements employed, and to the temperature difference between the junction. Accordingly, it is desirable that the thermoelements be made of such materials that, all other factors being equal, the highest potential is developed for the temperature difference between the hot and cold junctions. The electrical resistivity of the thermoelement member of the device and the thermal conductivity both should be as low as possible in order to reduce electrical losses and thermal losses.

Thermoelectric devices may be tested and a number indicating its relative effectiveness, called the figure of merit, may be computed from the test data. The higher the figure of merit, the more efficient is the thermoelectric design. The figure of merit, denoted as Z, is defined by:

$$Z=\frac{\alpha^2}{pK}$$

wherein $\alpha$ is the Seebeck coefficient in volts per degree centigrade (v./° C.), $p$ is the electrical resistivity in ohm-centimeters (ohm-cm.) and K is the thermal conductivity in watts per centimeter per degree C. (watts/cm. ° C.).

In some cases, another criterion often applied to describe the relative merit of a given thermoelectric material is the index of efficiency M. The higher the index of efficiency, the more efficient is the thermoelectric device in converting heat to electrical energy. The index of efficiency, denoted as M, for a thermoelement member may be defined as follows:

$$M=\frac{T\alpha^2}{4pK}$$

wherein T is the absolute temperatures and the other symbols have the meaning set forth above.

An object of the present invention is to provide a thermoelectric device comprising a thermoelement member having the formula $Na_xMn_{1-x}Te$ wherein $x$ varies from .1 to 0.0001.

Another object of the present invention is to provide a process for preparing a thermoelectric material having the formula $Na_xMn_{1-x}Te$ wherein $x$ varies from .01 to 0.0001 comprising reacting sodium telluride, tellurium and manganese telluride and removing excess tellurium by heating the reacted product at an elevated temperature for several hours.

Other objects will, in part, be obvious and will, in part, appear hereinafter.

For a better understanding of the nature and objects of the present invention, reference should be had to the detailed description and drawing in which:

Figure 1 is a graphical presentation of the electrical and thermoelectric properties of the material of this invention; and Fig. 2 is a side view, partially in cross-section of a thermoelectric generator.

In accordance with the present invention and attainment of the foregoing objects, there is provided a thermoelectric device comprising a first element member having the formula $Na_xMn_{1-x}Te$ wherein $x$ varies from .1 to 0.00001. If $x$ exceeds 0.01, it will not have a detrimental effect on the material; however, the solubility limit of Na in the composition at room temperature is substantially 0.01, and, therefore, is a practical limit on the composition.

The thermoelectric material of this invention, having the formula $Na_xMn_{1-x}Te$ wherein $x$ has the value given above may be prepared in accordance with the following reaction equation:

$$\frac{x}{2}Na_2Te+\frac{x}{2}Te+(1-x)MnTe\rightarrow Na_xMn_{1-x}Te$$

wherein $x$ has the value set forth above.

This reaction is unique in producing consistently the desired product. A reaction involving pure sodium as one of the reactants is unsatisfactory for thermoelectric elements since such reaction is quite violent in nature and yields a mixture of various products of unpredictable nature. The starting material $Na_2Te$ may be prepared through the reaction of a liquid ammonia solution of the alkali metal and finely powdered tellurium. The procedure for preparing $Na_2Te$ is set forth in detail in various references including Z. Elektrochem: 40, 588–93 (1934), E. Zintl, A. Harder and B. Dauth.

When the thermoelectric material of this invention is prepared in accordance with the above equation, the following procedure is preferably followed. The initial reacting materials, in the form of finely divided powders, are weighed out in predetermined quantities depending upon the amount of final product desired. The finely divided powders are then admixed in an inert atmosphere in a suitable mixer, such as a tumbling barrel, to a state of homogeneity. The finely divided homogeneous mixture is then pressed into compacts under a pressure sufficient to give coherent body, for example, 10,000 p.s.i. or more. The pelleted compacts are supported on a refractory, for example, a plate of magnesia or graphite, and disposed in an evacuated chamber of quartz or ceramic, the vacuum being below 0.1 mm. of Hg. The compacts are then heated slowly, preferably at a rate not exceeding 300° C. per hour, to a temperature within the range of from 650° to 950° C. and maintained at this elevated temperature for at least ½ hour. Satisfactory results have been achieved when compacts of 200 mesh fineness starting materials are heated at a rate of 200° C. per hour to a temperature of 700° C. and maintained at 700° C. for a period of approximately 24 hours. Compacts from larger particles or lower final temperatures may require longer heating periods.

After firing, the compacts are removed from the furnace and allowed to cool at room temperature. The material thus produced is suitable for limited use as a thermoelectric material, but it is of relatively low purity, has a low density and is not mechanically strong.

To produce a higher quality material having better properties, the cooled reaction product is removed from the reaction vessel and powdered under a protective atmosphere, such as argon or helium to a particle size within the range of from 40 to 325 mesh (U.S. Standard Sieve). The finely divided reaction product is then pressed into any desired pellet configuration at a pressure of from 10,000 to 200,000 p.s.i. or even higher. Satisfactory results have been achieved in forming pellets having a diameter of ⅜ inch and a length of 1 inch under a pressure of 150,000 p.s.i. The newly formed compacts or pellets are then again disposed in a graphite crucible or other inert refractory vessel, which graphite is sealed in an inert refractory bulb, for example, a quartz bulb under a vacuum below 0.1 mm./Hg and fired at a temperature of from 650° C. to 950° C. for a period of approximately 24 hours. After firing, the reaction product is removed from the furnace and allowed to cool to the ambient temperature while being maintained in the inert reaction vessel.

The reaction product at this stage may contain a slight excess of tellurium. If allowed to remain in the compact, the excess tellurium will vaporize at high temperatures resulting from the operation of thermoelectric devices and corrode the electrical contacts thereon or blister or break any encapsulation material which may be disposed about the thermoelements. The excess tellurium is believed to be present in the form $MnTe_2$ and is presumably present due to its displacement from the sodium manganese telluride by small amounts of oxygen contamination introduced during the preparation. This contamination apparently occurs despite very careful attempts to exclude oxygen from the reaction. To remove the excess tellurium, the pellet compacts were disposed in one end of a long closed quartz tube. The end of the tube containing the compacts is heated to a temperature of from approximately 500° C. to 1050° C., preferably at 650° C. and higher, whereby, the $MnTe_2$ is decomposed in accordance with the reaction equation:

$$MnTe_2 \rightarrow MnTe + \tfrac{1}{2}Te_2$$

The tellurium vapor generated is collected in the other end of the tube which is maintained at or near room temperature. The thermoelectric material thus produced has the formula $Na_xMn_{1-x}Te$, wherein $x$ has the values set forth above, is a p-type material and is stable up to 1050° C.

The following examples are illustrative of the practice of this invention:

EXAMPLE I

A quantity of 0.2330 gram of sodium previously washed with dry hexane under a flow of nitrogen, was placed in a liter glass reaction vessel. Distilled liquid ammonia, which had been previously dried with sodium, was introduced into the reaction vessel until it substantially filled the vessel. Then 0.6464 gram of powdered tellurium was slowly added to the reaction vessel. The mixture was stirred for 2 hours while being held at −33° C., during which time a precipitate of $Na_2Te$ formed. The liquid which contained any soluble sodium polytellurides or sodium amides was removed by decantation. The precipitated $Na_2Te$ was washed several times with freshly distilled dry ammonia, and then dried by heating in a vacuum at 250° C.

EXAMPLE II

Weighed amounts comprising 0.789 gram of $Na_2Te$ prepared in accordance with Example I, 0.580 gram of tellurium and 164.28 grams of manganese telluride were admixed in an inert atmosphere to a state of homogeneity. The admixture was pressed into ½ inch by ½ inch cylindrical pellets with a pressure of 10,000 p.s.i. The pellets were placed in a graphite boat and sealed under a vacuum of approximately .01 mm. Hg in a quartz bulb. The bulb was charged into a furnace and the pellets heated to a temperature of 700° C. at a rate of 200° C. per hour. The pellets were maintained at the 700° C. temperature for a period of approximately 24 hours. The quartz bulb was then removed from the furnace and allowed to cool. After cooling, the fired pellets were removed from the graphite boat and finely divided while under an inert argon atmosphere until the reaction product had a particle size of less than 200 mesh (U.S. Standard). The finely divided particles were then pressed into pellets having the ½ inch diameter and being approximately ½ inch in length under a pressure of 150,000 p.s.i. The pellets were then placed in a graphite boat and sealed in a quartz bulb. The quartz bulb was then charged into a furnace and heated to a temperature of approximately 700° C. at a rate of 200° C. per hour. The pellets were fired at the 700° C. temperature for approximately 24 hours. The fired pellets were removed from the furnace and allowed to cool to room temperature. The pellets were then removed from the graphite boat and placed in a graphite crucible. The graphite crucible was placed in a long quartz tube which was then evacuated. The end of the tube containing the pellets was heated to a temperature of approximately 650° C. while the other end of the tube was maintained at approximately room temperature. The pellets were heated at 650° C. for approximately 48 hours during which time any surplus manganese ditelluride within the pellets was decomposed and the free tellurium evolved therefrom was condensed at the end of the tube being maintained at room temperature. The resulting pellets had a composition of substantially $Na_{.01}Mn_{.99}Te$.

EXAMPLE III

The procedure of Example II was repeated with the exception that the pellets were heated to temperatures of 500° C., 750° C. and 850° C. to remove any excess manganese telluride.

The Seebeck coefficient ($\alpha$) and resistivity ($p$) measured at room temperature, of the pellets prepared using various temperatures to remove surplus tellurium were determined and are set forth in tabular form below:

*Table I*

| Temperature (° C.) | Time (hrs.) | $\alpha$($\mu$ v./° C.) | $p$(ohm-cm.) |
|---|---|---|---|
| 500 | 48 | 170 | 0.0095 |
| 650 | 48 | 180 | 0.0058 |
| 750 | 24 | 206 | 0.0087 |
| 850 | 20 | 215 | 0.0070 |

The electrical and thermoelectrical properties of the pellets heated to 650° C. to remove excess tellurium were determined over a wide temperature range and are set forth in graphical form in Fig. 1.

EXAMPLE IV

The procedure of Example II was followed to produce the composition $Na_{.001}Mn_{.999}Te$. Tests indicated the properties of the purified pellets of this composition at room temperature to be:

$$\alpha = 351 \mu v./° C., \text{ and } p = 0.083 \text{ ohm-cm.}$$

Referring to Fig. 2 of the drawing, there is illustrated a thermoelectric device suitable for producing an electrical current from heat. A thermally insulating wall 10 so formed as to provide suitable furnace chamber or other thermal barrier is perforated to permit the passage therethrough of a positive thermoelectric member 12 comprised of the material of this invention and a negative thermoelectric element 14 comprised of, for example, indium arsenide with small additions of phosphorus, constantan or nickel. An electrically conducting strip 16 comprised of a suitable metal, for example, molybdenum, tungsten, iron or the like is joined to an end face of member 12 and to the end face of member 14 within the chamber so as to provide good electrical and thermal contact therewith. To provide good contacts, the end faces of the members 12 and 14 may be coated with thin layers 18 and 20, respectively, of metal, for example, by vacuum evaporation or by use of ultrasonic brazing whereby good electrical contact is obtained. The metal strip 16 may be brazed or soldered to the metal layers 18 and 20. A pressure-type contact would also be satisfactory. The metal strip 16 may be provided with suitable fins or other extended surface means (not shown) for conducting heat efficiently thereto from the furnace chamber or other heat source to which it is exposed. At the end of the member 12 located on the other side of wall 10 is attached a metal plate or strip 22 by brazing or soldering in the manner as was employed in attaching strip 16 to the other end face. Similarly, a metal strip or plate 24 may be connected to the end of member 14. The plates 22 and 24 may be provided with heat dissipating fins or other cooling means whereby heat conducted thereto may be dissipated. The surfaces of the plates 22 and 24 may also be cooled by passing a current of a fluid, such as water or air, across them. The elements 12 and 14 may be encapsulated in a resin or in a metal shell, having an inert or vacuum atmosphere, to prevent oxidation of the elements by the ambient. An electrical conductor 26 joining a load 28 is electrically connected to the plates 22 and 24. A switch 30 is interposed in the conductor 26 to enable the electrical circuit to be opened and closed, as desired. When the switch 30 is moved to the closed position, an electrical current flows between members 12 and 14 and energizes the load 28.

It will be appreciated that a plurality of pairs of positive and negative members may be joined in a series in order to produce a plurality of cooperating thermoelements. In a similar manner, each of the thermoelements will be disposed with one junction in the furnace or exposed to another source of heat while the other junction is cooled by passing a current of water or blowing air thereon or the like. Due to the relative difference in temperature of the junctions, an electrical voltage will be generated in the thermal elements. By joining a series of pluralities of the thermoelements, a direct current of any suitable voltage may be generated.

While the element 12 has been shown to be comprised entirely of $Na_xMn_{1-x}Te$, it will be understood that the $Na_xMn_{1-x}Te$ material may comprise only a portion of the element the remainder being comprised of one or more materials of the same thermoelectric sign.

While the material of this invention is particularly suitable as a power generating thermoelectric material, it does function efficiently as a refrigeration thermoelectric material at temperatures below −100° C.

It will be appreciated that the above description and drawing are only exemplary and not exhaustive of the invention. While the invention has been described with reference to particular embodiments and example, it will be understood that modifications, substitutions and the like may be made therein without departing from the scope.

We claim as our invention:

1. A process for preparing a thermoelectric material having the formula $Na_xMn_{1-x}Te$, wherein $x$ varies from 0.1 to 0.0001 comprising admixing in an inert atmosphere, predetermined quantities of $Na_2Te$, MnTe and Te all in particle form, pressing said admixture into compacts, and firing said compacts at a temperature within the range of 650° C. to 950° C. for at least 0.5 hour.

2. A process for preparing a thermoelectric material having the formula $Na_xMn_{1-x}Te$, wherein $x$ varies from 0.1 to 0.0001 comprising admixing, in an inert atmosphere, predetermined quantities of $Na_2Te$, MnTe and Te all in particle form, pressing said admixture into compacts with a pressure of at least 10,000 p.s.i., and firing said compacts at a temperature within the range of 650° C. to 950° C. for at least 0.5 hour.

3. A process for preparing a thermoelectric material having the formula $Na_xMn_{1-x}Te$, wherein $x$ varies from 0.1 to 0.0001 comprising admixing, in an inert atmosphere, predetermined quantities of $Na_2Te$, MnTe and Te all in particle form, pressing said admixture into compacts with a pressure of at least 10,000 p.s.i. and firing said compacts at a temperature within the range of 650° C. to 950° C. for at least 0.5 hour, grinding the reaction product, in an inert atmosphere, to particles having a size within the range of 40 to 325 mesh, pressing the particles into a compact with a pressure of from 10,000 p.s.i. to 200,000 p.s.i. and firing the compacts for approximately 24 hours at a temperature within the range of from 650° C to 950° C.

4. A process for preparing a thermoelectric material having the formula $Na_xMn_{1-x}Te$, wherein $x$ varies from 0.1 to 0.0001 comprising admixing, in an inert atmosphere, predetermined quantities of $Na_2Te$, MnTe and Te all in particle form, pressing said admixture into compacts with a pressure of at least 10,000 p.s.i., and firing said compacts at a temperature within the range of 650° C. to 950° C. for at least 0.5 hour, grinding the reaction product, in an inert atmosphere, to particles having a size within the range of 40 to 325 mesh, pressing the particles into a compact with a pressure of from 10,000 p.s.i. to 200,000 p.s.i. and firing the compacts for approximately 24 hours at a temperature within the range of from 650° C. to 950° C., and removing the excess tellurium by heating at a temperature of 500° C. to 1050° C.

References Cited in the file of this patent

UNITED STATES PATENTS 2,890,260 Fredrick et al. ............ June 9, 1959